United States Patent
Han et al.

(10) Patent No.: US 7,432,768 B2
(45) Date of Patent: Oct. 7, 2008

(54) VOLTAGE CONTROLLED DIGITAL ANALOG OSCILLATOR AND FREQUENCY SYNTHESIZER USING THE SAME

(75) Inventors: Seon Ho Han, Daejeon (KR); Jin Ho Han, Daejeon (KR); Mun Yang Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 206 days.

(21) Appl. No.: 10/572,901

(22) PCT Filed: Jun. 22, 2004

(86) PCT No.: PCT/KR2004/001505

§ 371 (c)(1),
(2), (4) Date: Mar. 21, 2006

(87) PCT Pub. No.: WO2005/062462

PCT Pub. Date: Jul. 7, 2005

(65) Prior Publication Data

US 2007/0030080 A1 Feb. 8, 2007

(30) Foreign Application Priority Data

Dec. 22, 2003 (KR) .................. 10-2003-0095038

(51) Int. Cl.
*H03L 7/00* (2006.01)
(52) U.S. Cl. .............. 331/16; 331/34; 331/177 R; 331/167; 331/177 V; 331/117 R; 331/117 FE
(58) Field of Classification Search .......... 331/117 FE, 331/117 R, 167, 177 V, 16, 34, 177 R
See application file for complete search history.

(56) References Cited

U.S. PATENT DOCUMENTS

| 5,179,359 | A | 1/1993 | McLeod |
| 5,739,730 | A | 4/1998 | Rotzoll |
| 6,028,488 | A | 2/2000 | Landman et al. |
| 6,137,372 | A | 10/2000 | Welland |
| 6,496,556 | B1 * | 12/2002 | Huehne et al. .......... 377/2 |
| 6,597,249 | B2 | 7/2003 | Chien et al. |
| 6,803,829 | B2 * | 10/2004 | Duncan et al. .......... 331/34 |

FOREIGN PATENT DOCUMENTS

KR 2002 0069685 9/2002

OTHER PUBLICATIONS

Chi-Wa Lo et al, "A 1.5-V 900-MHz Monolithic CMOS Fast-Switching Frequency Synthesizer for Wireless Applications," 2000 Symposium on VLSI Circuits Digest of Technical Papers, pp. 238-241.

(Continued)

*Primary Examiner*—Arnold Kinkead
(74) *Attorney, Agent, or Firm*—Ladas & Parry LLP

(57) ABSTRACT

Provided are a voltage controlled digital analog oscillator and a frequency synthesizer using the same, the oscillator comprising an oscillator having a frequency of an output signal being determined by a voltage inputted to an analog input end and a digital value inputted to a digital input end; and a digital tuner for comparing the voltage inputted to the analog input end to first and second threshold voltages and changing the digital value inputted to the digital input end according to the result, whereby it is possible to obtain a broadband frequency output with less noise.

20 Claims, 11 Drawing Sheets

OTHER PUBLICATIONS

Frank Herzel et al, "An Integrated CMOS PLL for Low-Jitter Applications," IEEE Transactions on Circuits and Systems—II: Analog and Digital Signal Processing, vol. 49, No. 6, Jun. 2002, pp. 427-429.

Tsung-Hsien Lin et al, "A 900MHz, 2.5mA CMOS Frequency Synthesizer with an Automatic SC Tuning Loop," Electrical Engineering Department, University of California, Los Angeles CA 90095-1594, pp. 375-378.

Yido Koo et al, "A Fully-Integrated CMOS Frequency Synthesizer with Charge-Averaging Charge Pump and Dual-Path Loop Filter for PCS- and Cellular-CDMA Wireless Systems," 2001 Symposium on VLSI Circuits Digest of Technical Papers, pp. 43-46.

Tsung-Hsien Lin et al, "A 900MHz, 2.5mA CMOS Frequency Synthesizer with an Automatic SC Tuning Loop," Electrical Engineering Department, University of California, Los Angeles CA 90095-1594, pp 375-378, date unknown.

* cited by examiner

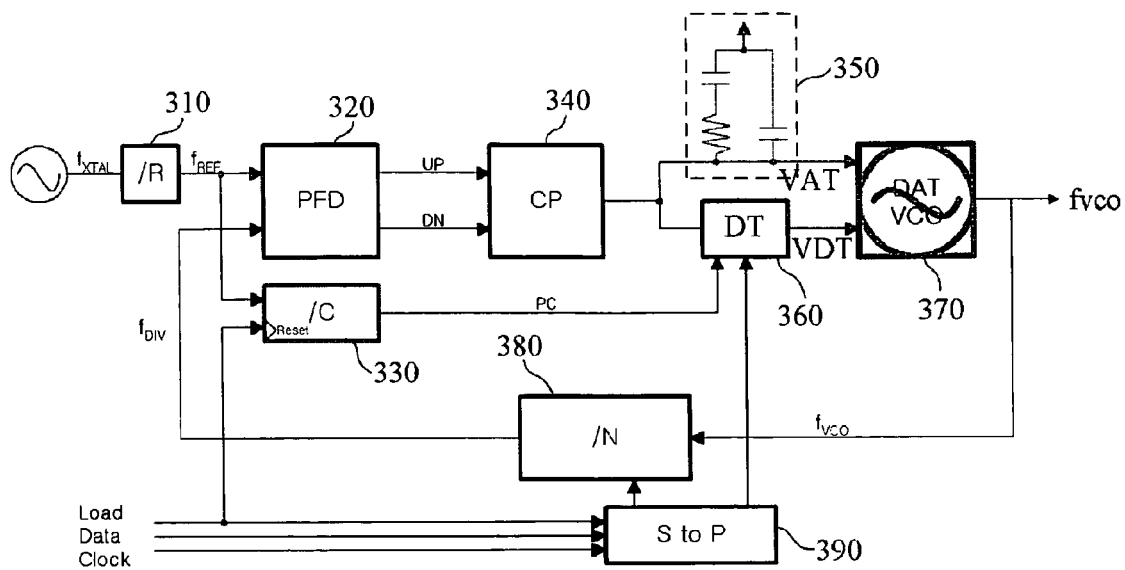
[Fig. 6]
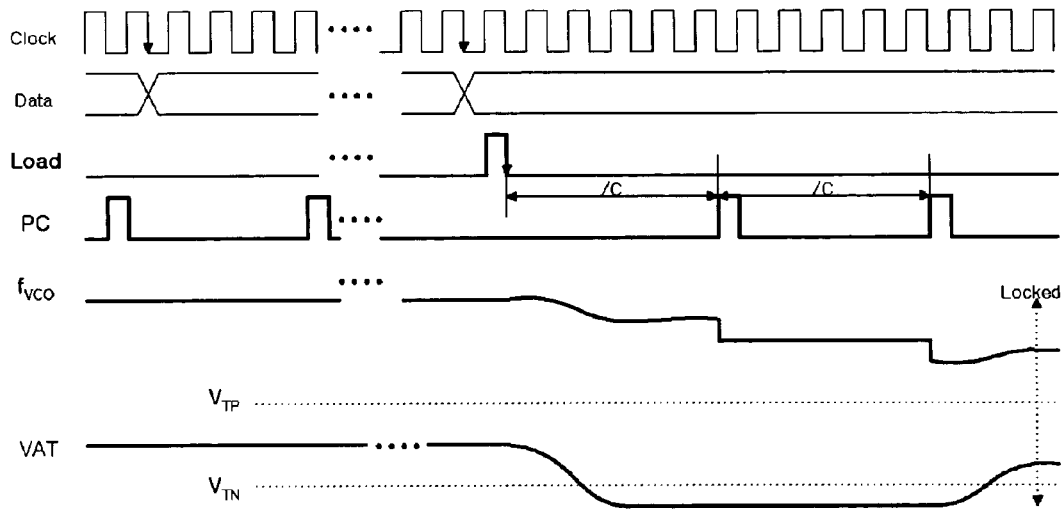
[Fig. 7]
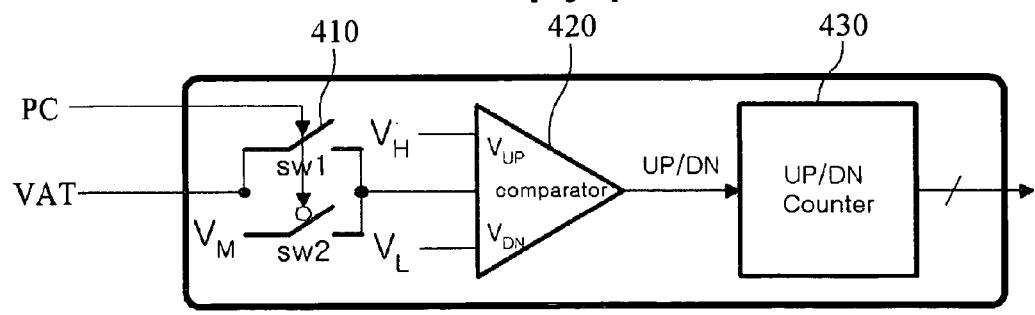
[Fig. 8]

[Fig. 9]
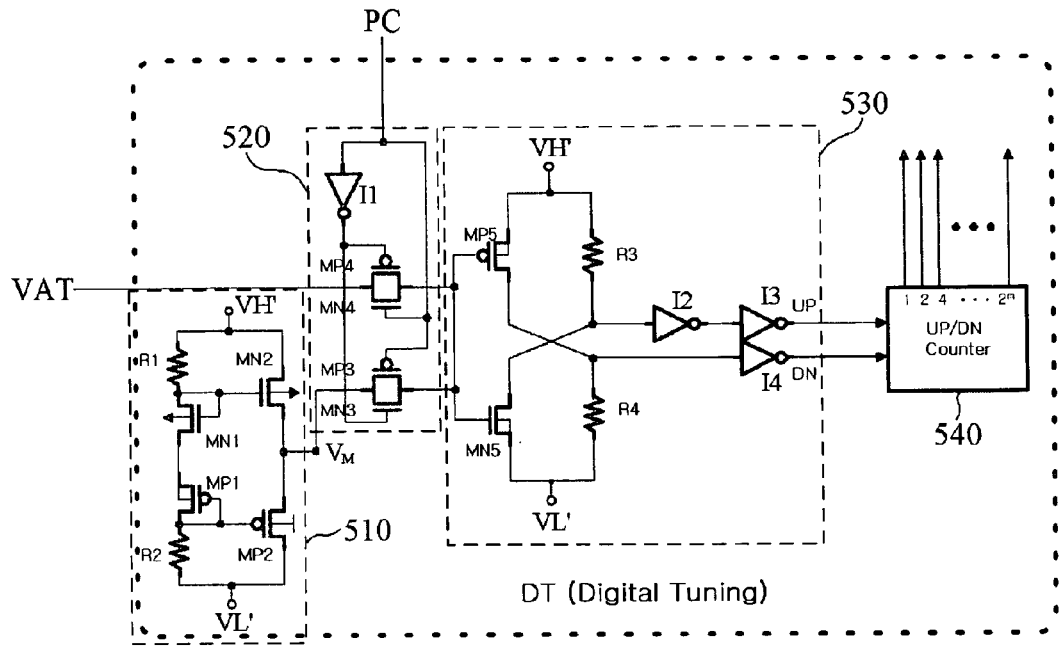
[Fig. 10]
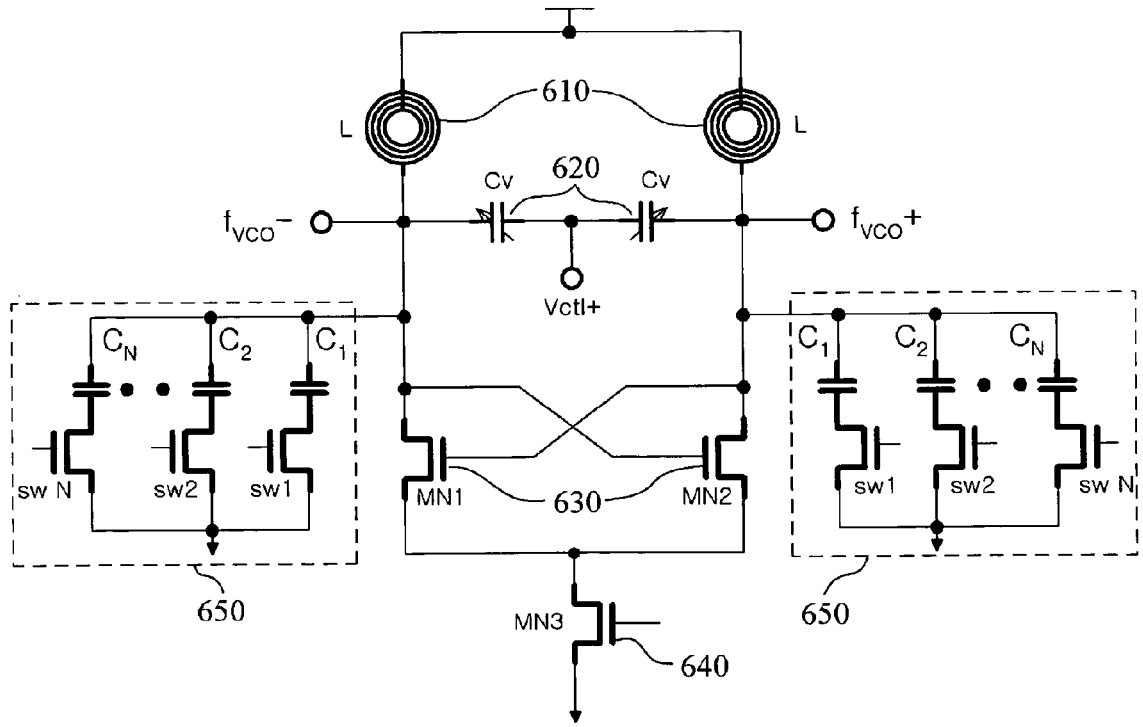

[Fig. 11]
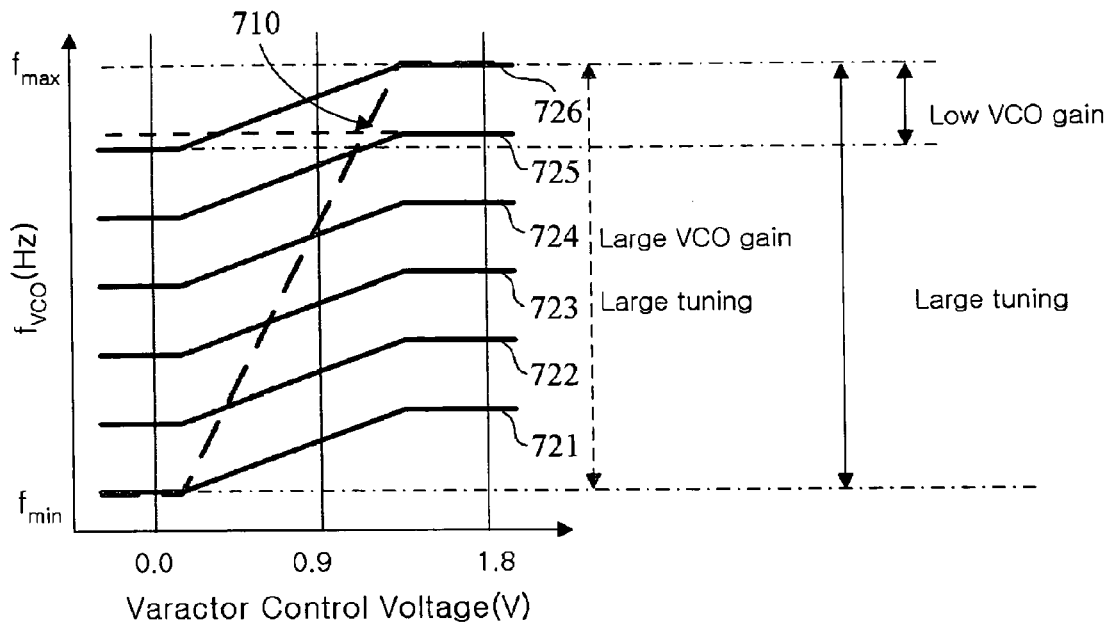
[Fig. 12]
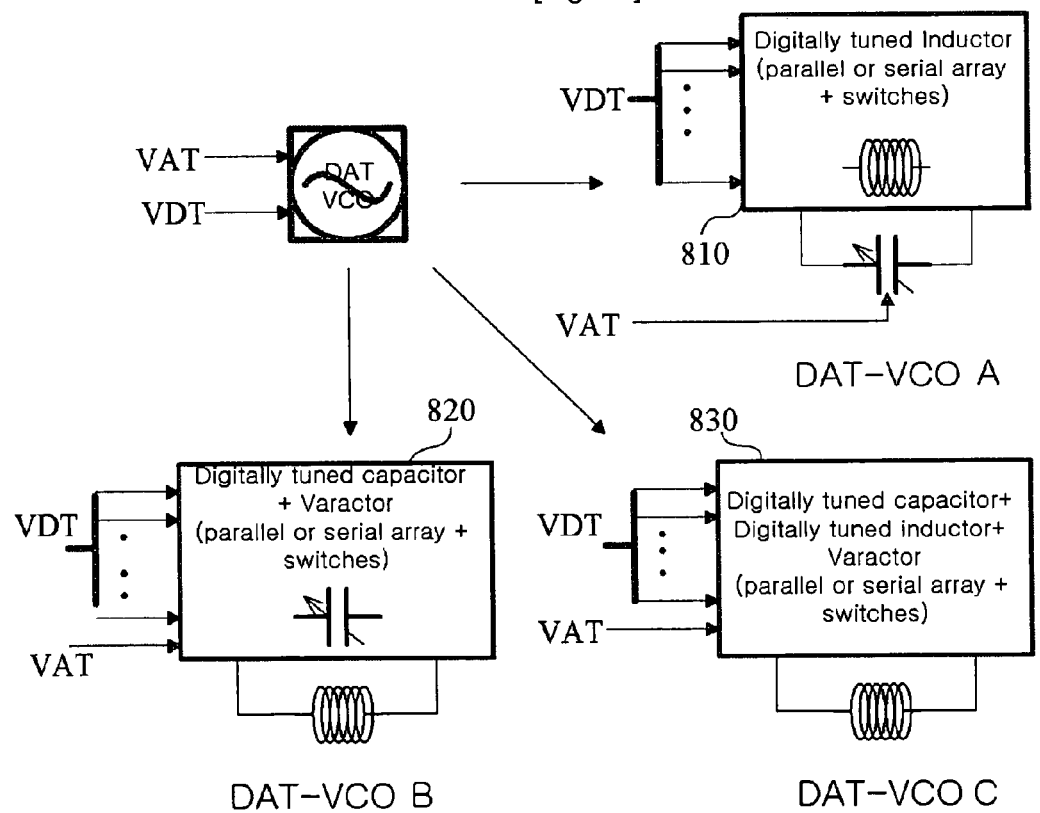

[Fig. 13]
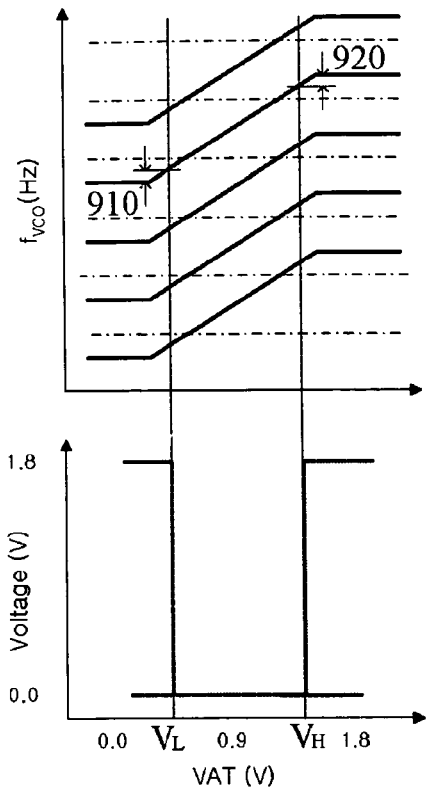
[Fig. 14]
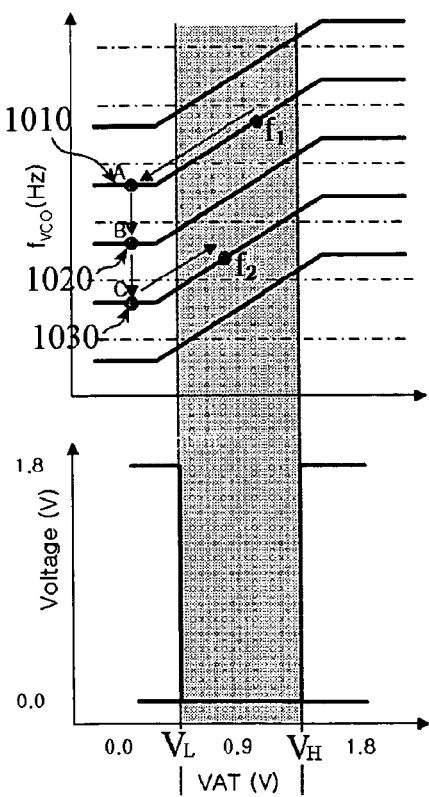

[Fig. 15]
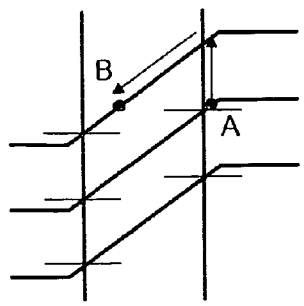
[Fig. 16]
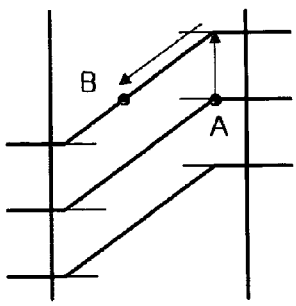
[Fig. 17]
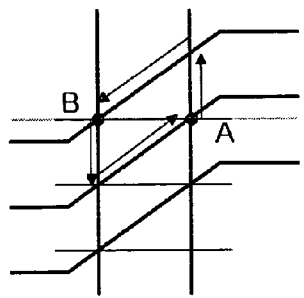
[Fig. 18]
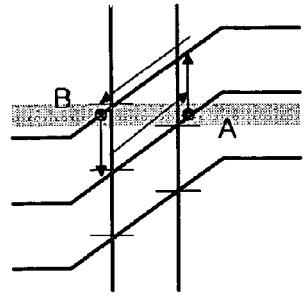
[Fig. 19]
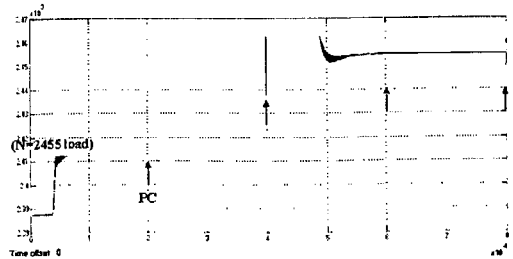

[Fig. 20]
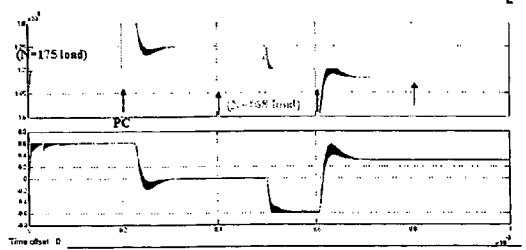
[Fig. 21]
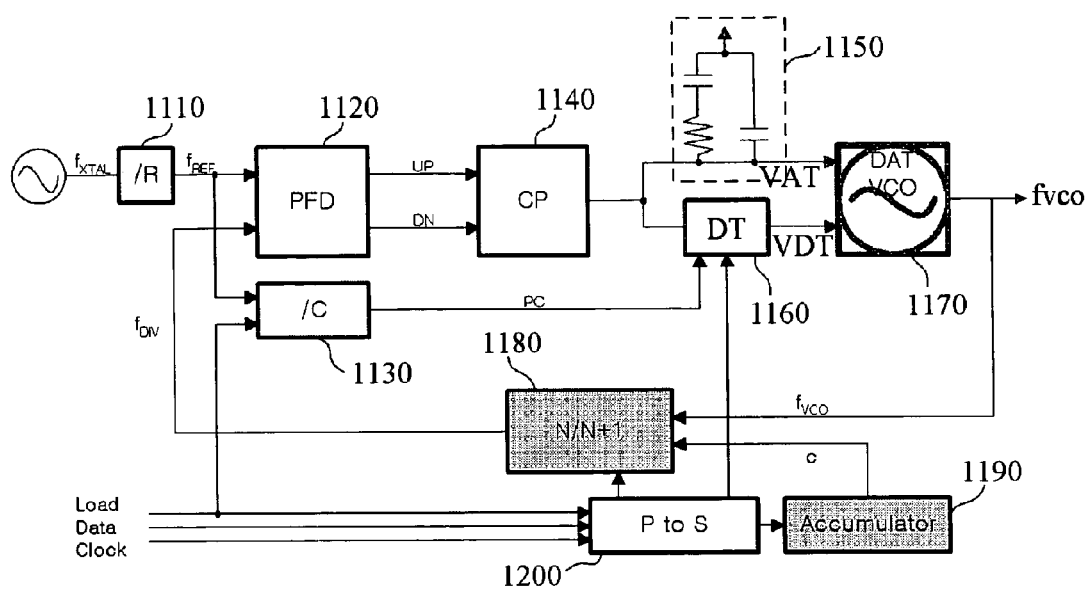

VOLTAGE CONTROLLED DIGITAL ANALOG OSCILLATOR AND FREQUENCY SYNTHESIZER USING THE SAME

CROSS-REFERENCE TO RELATED APPLICATIONS

The present application claims priority to the international application published under the Patent Cooperation Treaty (PCT) having the application number PCT/KR2004/001505 filed on Jun. 22, 2004 and also claims priority to the Korean patent application number 10-2003-0095038 filed on Dec. 22, 2003, both of which are incorporated herein reference in their entirety.

BACKGROUND

1. Field of the Invention

The present invention relates to an oscillator and a frequency synthesizer and, more particularly, to a voltage controlled digital analog oscillator and a frequency synthesizer using the same.

2. Discussion of Related Art

An integer-N frequency synthesizer according to a prior art will be described with reference to FIGS. 1 to 4.

FIG. 1 is a block diagram of an integer-N frequency synthesizer according to a prior art, which employs a phase locked loop (hereinafter, referred to as PLL) with a negative feedback. As shown in FIG. 1, the conventional frequency synthesizer is composed of primary blocks, as follows: an R divider 110 for outputting a frequency $f_{REF}$ obtained by dividing a reference frequency $f_{XTAL}$ supplied from the exterior by R; a phase frequency detector (PFD) 120 for comparing frequencies and phases of two input signals $f_{REF}$ and $f_{DIV}$, and outputting signals DN and UP, corresponding to the differences; a current pump (CP) 130 for outputting charges corresponding to the outputs DN and UP of the phase frequency detector to a low pass filter (hereinafter, referred to as LPF); the LPF 140 for serving as a loop filter for the entire frequency synthesizer and for supplying a voltage, which controls an output frequency $f_{VCO}$ of a subsequent voltage controlled oscillator (hereinafter, referred to as VCO); the VCO 150 for outputting an oscillating frequency $f_{VCO}$ in proportion to an input control voltage; and an N divider 160 for performing a dividing operation to implement a frequency ratio N of the output frequency $f_{DIV}$ of the N divider to the output frequency $f_{VCO}$ of the VCO so that a desired VCO output frequency $f_{VCO}$ is obtained. A serial-to-parallel (S-to-P) block 170 is a subsidiary block for supplying serial digital data from the exterior into the frequency synthesizer in parallel.

The conventional frequency synthesizer, as described above, forms a negative feedback loop. Thus, if the dividing ratio of the N divider 160 is determined, the frequency and phase synchronizing process is performed on two input signals of the phase frequency detector 120, and then the frequencies and phases are synchronized, so that a higher frequency $f_{VCO}$ is obtained by the synthesis at the output of the VCO 150, in which the higher frequency is equal to N times the output frequency $f_{REF}$ of the R divider.

The VCO 150 in the frequency synthesizer may be implemented in several manners and types according to a required output frequency or an application field. In a radio frequency (RF) front end, which requires a higher output frequency and a considerably excellent phase noise property, the VCO is implemented by creating negative resistance using an active circuit, namely, using a positive feedback, for compensating an energy loss (generated at parasitic resistance components) in an LC resonant circuit or an LC resonant network, which generally makes use of one inductor and one capacitor. This LC-tuned VCO can vary inductance L or capacitance C of an LC resonator in order to vary an output frequency according to an input control voltage. Generally, the variance of a capacitor is easier to be implemented than the variance of an inductor. Consequently, the LC-tuned VCO primarily includes an inductor having fixed inductance and a varactor having capacitance capable of being varied depending on an input voltage.

FIG. 2 is a circuit diagram of a differential LC tuned VCO that is used in the frequency synthesizer structure according to the prior art illustrated in FIG. 1. In FIG. 2, the VCO is composed of inductors 210 in a resonant circuit; variable capacitors 220 in the resonant circuit; active elements 230 composed of transistors for allowing the LC resonant circuit to continue to maintain resonance by obtaining negative resistance through a formed negative feedback; and an active element 240 for providing a current bias for the resonant circuit.

FIG. 3 illustrates a simplified curve of an output frequency to an input voltage of the VCO that uses the inductor and the variable capacitor represented in FIG. 2. In FIG. 3, it can be seen that the output frequency fvco is proportion to an input voltage V, continuously.

The VCO shown in FIGS. 2 and 3 must satisfy a frequency tuning range needed for any system in a predetermined range of the control voltage. Therefore, as shown in FIG. 3, a VCO gain indicating a ratio of the change in frequency to the change in control voltage is represented by Equation 1.

$$VCO\ gain = \frac{\Delta f_{VCO}}{\Delta V_{control}} \qquad \text{Equation 1}$$

As seen from Equation 1, the broader a needed frequency band, the larger a defined VCO gain.

In addition, the frequency change in the VCO results from the capacitance change in the resonant circuit. As a variable capacitor, a P-N junction varactor or an accumulation mode MOS varactor may be used, in which the varactor is based on the junction capacitance varied depending on an applied voltage in a silicon process. The performance index of the variable capacitor may be represented by Equation 2.

$$\text{Tuning capability} = \frac{C_{max}}{C_{min}} \qquad \text{Equation 2}$$

In Equation 2, $C_{max}$ means the maximum variable capacitance and $C_{min}$ means the minimum variable capacitance.

A capacitor with larger capacitance should be used to expand the range of the variable capacitances in such variable capacitors. However, there is a problem that non-variable parasitic capacitance increases as the variable capacitances increase. Further, in the case of using a varactor with larger capacitance at any desired frequency an inductor with relatively smaller inductance should be used, resulting in the increases of current consumption.

Further, the increase in the variable capacitance leads to the increase of the VCO gain, whereby large noise that incomes over an input signal line controlling the frequency of the VCO becomes generated at the output of the VCO, and thus, the performance of the frequency synthesizer gets deteriorated. Phase output noise of the VCO to the noise incoming over the input signal line, $L\{\omega_m\}$, is represented by Equation 3.

$$L\{\omega_m\} = \left(\frac{K_{VCO} \cdot A_m}{2 \cdot \omega_m}\right)^2 \quad \text{Equation 3}$$

In Equation 3, $K_{VCO}$ indicates the gain of the VCO, $A_m$ indicates the size of input noise, and $\omega_m$ indicates the offset angle frequency. It can be further analogized from this equation that, in FIG. 3, phase noise appearing at a center portion having the largest VCO gain is not good and the phase noise appearing at both edges having no VCO gain is the best. Consequently, there are problems that it is difficult to obtain an excellent phase noise output over a whole frequency variance range of the VCO and also to obtain consistent performance.

FIG. 4 shows a result of a simulation experiment for a frequency synchronizing process in the frequency synthesizer using the VCO having the inductor and the variable capacitor according to the prior art as represented in FIG. 1. When the dividing ratio N is changed, the frequencies and the phases are finally synchronized through a nonlinear frequency synchronizing process, and thus, reaching a locking state, so that a desired synthesized frequency is obtained at the output of the VCO.

The integer-N frequency synthesizer according to the prior art, as described above, has some problems that in a state where both the frequencies and the phases are synchronized, several mismatches are generated between UP and DOWN currents created in the current pump, and spur with large noise power is created at the output of the VCO due to the noise having a period of the input frequency of the phase frequency detector. It is noted that this spur appears in proportion to the VCO gain. Therefore, the spur output can be reduced when the VCO gain is reduced in a constant size of any periodic signal. However, a total loop gain would be reduced if only the VCO gain is reduced in designing the PLL loop. Thus, there is a problem that VCO output phase noise of in-band, and input phase noise of the phase frequency detector, the current pump or the like of out-band may increase due to the reduced loop gain, in case where the PLL is in a locking state.

Hereinafter, a fractional-N frequency synthesizer according to a prior art will be described with reference to FIG. 5.

FIG. 5 is a fractional-N frequency synthesizer according to a prior art. As shown in FIG. 5, the fractional-N frequency synthesizer comprises an N/N+1 divider 180 and an accumulator 190 in place of the N divider of the integer-N frequency synthesizer, as compared the fractional-N frequency synthesizer with the integer-N frequency synthesizer according to the prior art illustrated in FIG. 1. Other blocks are the same in the two frequency synthesizers. The N/N+1 divider 180 is a divider circuit having a dual—modulus dividing ratio of dividing ratios N and N+1, in which one of the N and N+1 dividing ratios is selected by a carry signal. The accumulator 190 accumulates incoming values and generates the carry signal according to the result. With such a configuration, the fractional-N frequency synthesizer can output a frequency between N times and N+1 times the output frequency $f_{REF}$ of the/R divider as a VCO output frequency $f_{VCO}$. However, the present fractional-N frequency synthesizer also has problems similar to the aforementioned integer-N frequency synthesizer.

SUMMARY OF THE INVENTION

Accordingly, the present invention is contrived to solve the aforementioned problems. The present invention is directed to an oscillator and a frequency synthesizer having a broad frequency variance range, a small VCO gain, small parasitic capacitance, and less noise and spur. In addition, an oscillator and a frequency synthesizer of the present invention can be digitally controlled.

One aspect of the present invention is to provide a voltage controlled digital analog oscillator, comprising: an oscillator a frequency of an output signal is determined by a voltage inputted to an analog input end and a digital value inputted to a digital input end; and a digital tuner for comparing the voltage inputted to the analog input end with first and second threshold voltages, and changing the digital value inputted to the digital input end according to the result.

Here, a difference between the frequency of the output signal by the first threshold voltage and the frequency of the output signal by the second threshold voltage is larger than a minimum frequency width that can be changed by the change of the digital value, while the digital value is fixed.

In a preferred embodiment of the present invention, the oscillator comprises first and second inductors, first and second variable capacitors, first and second NMOS transistors, a current power supply and a 2's multiple number of switched capacitors, wherein: the first inductor is connected to a higher voltage power supply and a first node; the second inductor is connected to the higher voltage power supply and a second node; the first capacitor is connected to the first node and the analog input end; the second capacitor is connected to the second node and the analog input end; a first source and drain is connected to the first node, a gate is connected to the second node, and a second source and drain is connected to a third node, in the first NMOS transistor; a first source and drain is connected to the second node, a gate is connected to the first node, and a second source and drain is connected to the third node, in the second NMOS transistor; the current power supply is connected to the third node and a lower voltage power supply; both ends of half of the switched capacitors are connected between the first node and the lower voltage power supply and switches thereof are connected to the digital input end; both ends of the remainder of the switched capacitors are connected between the second node and the lower voltage power supply and switches thereof are connected to the digital input end; and a first output of differential outputs is connected to the first node and a second output is connected to the second node.

In another embodiment of the present invention, the oscillator may comprise: an inductor; a first variable capacitor having capacitance varied depending on the voltage inputted to the analog input end; and a second variable capacitor including a plurality of capacitors, and having capacitance varied by the digital value inputted to the digital input end, wherein the inductor, the first variable capacitor and the second variable capacitor are connected to one another in parallel.

In a still another embodiment of the present invention, the oscillator may comprise: a variable capacitor having capacitance varied depending on the voltage inputted to the analog input end; and a variable inductor including a plurality of inductors, and having inductance varied by the digital value inputted to the digital input end, wherein the variable capacitor and the variable inductor are connected to each other in parallel.

Otherwise, the oscillator may include: a variable inductor including a plurality of inductors, and having inductance varied by the digital value inputted to the digital input end; a first variable capacitor having capacitance varied depending on the voltage inputted to the analog input end; and a second variable capacitor including a plurality of capacitors, and having capacitance varied by the digital value inputted to the digital input end, wherein the variable inductor, the first variable capacitor and the second variable capacitor are connected to one another in parallel.

Meanwhile, the digital tuner includes: a first element for generating an intermittent signal; and a second element for comparing the voltage inputted to the analog input end with the first and the second threshold voltages, and changing the digital value inputted to the digital input end according to the result, in case where the intermittent signal is generated. Here, the first element receives a signal having a predetermined frequency, and outputs a signal having a frequency divided by a predetermined integer as the intermittent signal. In addition, the second element includes: a switch for outputting the voltage inputted to the analog input end when the intermittent signal is inputted, and outputting a voltage between the first threshold voltage and the second threshold voltage, otherwise; a comparator for comparing the output voltage of the switch with the first and the second threshold voltages, and outputting the result; and a counter for performing up-counting, down-counting, or no counting according to the output of the comparator. Wherein, the predetermined integer can be changed by a signal given from the exterior, and the value of the counter can be changed by a signal given from the exterior.

Another aspect of the present invention is to provide a frequency synthesizer comprising a phase frequency detector, a current pump, a low pass filter, a digital tuner, an oscillator and a first divider, wherein: the phase frequency detector compares frequency and phase of a predetermined input signal with those of an output signal of the first divider, and outputs a signal for controlling the current pump according to the result; the current pump supplies any one of a positive current and a negative current to the low pass filter depending on the output signal of the phase frequency detector; the low pass filter receives an output current of the current pump, and outputs a voltage inputted to an analog input end of the oscillator; the digital tuner intermittently compares the voltage inputted to the analog input end of the oscillator with first and second threshold voltages, and changes a digital value inputted to a digital input end of the oscillator according to the result; the oscillator changes and outputs a frequency of the output signal, depending on the changes of the voltage inputted to the analog input end and the digital value inputted to the digital input end; and the first divider outputs a signal having the frequency of the output signal of the oscillator divided by a first integer.

Here, a difference between the frequency of the output signal of the oscillator by the first threshold voltage and the frequency of the output signal of the oscillator by the second threshold voltage is larger than a minimum frequency width of the output signal of the oscillator that may be changed by the change of the digital value inputted to the digital input end of the oscillator, while the digital value inputted to the digital input end of the oscillator is fixed.

In a preferred embodiment of the present invention, the frequency synthesizer may further comprise a second divider for receiving a signal having a predetermined frequency, and inputting a signal having the frequency divided by a second integer, as the predetermined input signal of the phase frequency detector.

In a preferred embodiment of the present invention, the low pass filter comprises a resistor, and first and second capacitors, wherein: both ends of the resistor and the first capacitor, which are connected in serial, are connected to a first node and a second node; the second capacitor is connected to the first node and the second node; the first node is connected to the input end and the output end; and the second node is connected to a voltage power supply. In addition, the digital tuner includes: a first element for receiving the predetermined input signal of the phase frequency detector, and outputting a signal having a frequency of the signal divided by a third integer, as an intermittent signal; and a second element for comparing the voltage inputted to the analog input end of the oscillator with the first and the second threshold voltages, and changing the digital value inputted to the digital input end of the oscillator according to the result, in case where the intermittent signal is generated.

Still another aspect of the present invention is to provide a frequency synthesizer comprising a phase frequency detector, a current pump, a low pass filter, a digital tuner, an oscillator and a first divider, wherein: the phase frequency detector compares frequency and phase of a predetermined input signal with those of an output signal of the first divider, and outputs a signal for controlling the current pump according to the result; the current pump supplies any one of a positive current and a negative current to the low pass filter depending on the output signal of the phase frequency detector; the low pass filter receives an output current of the current pump, and outputs a voltage inputted to an analog input end of the oscillator; the digital tuner intermittently compares the voltage inputted to the analog input end of the oscillator with first and second threshold voltages, and changes a digital value inputted to a digital input end of the oscillator according to the result; the oscillator changes and outputs a frequency of the output signal, depending on the changes of the voltage inputted to the analog input end and the digital value inputted to the digital input end; and the first divider outputs the frequency of the output signal of the oscillator divided by a first integer in a predetermined period, and by a value obtained by adding 1 to the first integer in other periods.

Here, a difference between the frequency of the output signal of the oscillator by the first threshold voltage and the frequency of the output signal of the oscillator by the second threshold voltage is larger than a minimum frequency width of the output signal of the oscillator that may be changed by the change of the digital value inputted to the digital input end of the oscillator, while the digital value inputted to the digital input end of the oscillator is fixed.

In a preferred embodiment of the present invention, the first divider includes: a first element for performing an accumulation operation and outputting a signal for determining whether to divide the frequency of the output signal of the oscillator by the first integer, or by the value obtained by adding 1 to the first integer, according to the result; and a second element for outputting the frequency of the output signal of the oscillator divided by the first integer or the value obtained by adding 1 to the first integer, according to the output signal of the first element. In addition, the digital tuner includes: a first element for receiving the predetermined input signal of the phase frequency detector and outputting a signal having a frequency of the signal divided by a predetermined integer, as an intermittent signal; and a second element for comparing the voltage inputted to the analog input end of the oscillator with the first and second threshold voltages, and changing the digital value inputted to the digital input end of the oscillator according to the result, in case where the intermittent signal is generated.

BRIEF DESCRIPTION OF THE DRAWINGS

FIG. 6 is a block diagram of a frequency synthesizer according to a preferred embodiment of the present invention;

FIG. 7 is a waveform diagram illustrating an elementary operation of a frequency synthesizer according to an embodiment of the present invention;

FIG. 8 is an exemplary circuit diagram illustrating a digital tuner that can be adopted in the frequency synthesizer of FIG. 6;

FIG. 9 is another exemplary circuit diagram illustrating a digital tuner that can be adopted in the frequency synthesizer of FIG. 6;

FIG. 10 is a circuit diagram of a digital analog tuning (hereinafter, referred as to DAT) oscillator adopted in the frequency synthesizer of FIG. 6;

FIG. 11 is a graph representing an output frequency property to an input voltage of the VCO according to the prior art and the DAT oscillator of FIG. 10;

FIG. 12 is a diagram representing examples of a configurable resonant circuit of a DAT oscillator;

FIGS. 13 and 14 are diagrams for explaining a DC property and a frequency tracking process of a frequency synthesizer according to an embodiment of the present invention;

FIGS. 15 to 18 are diagrams for explaining stability of a frequency synthesizer according to a preferred embodiment of the present invention;

FIGS. 19 and 20 are diagrams illustrating a result of a simulation experiment for a transient response of the frequency synthesizer according to a preferred embodiment of the present invention; and FIG. 21 is a diagram schematically illustrating a fractional-N frequency synthesizer according to another embodiment of the present invention.

DETAILED DESCRIPTION OF PREFERRED EMBODIMENTS

Figure 1:
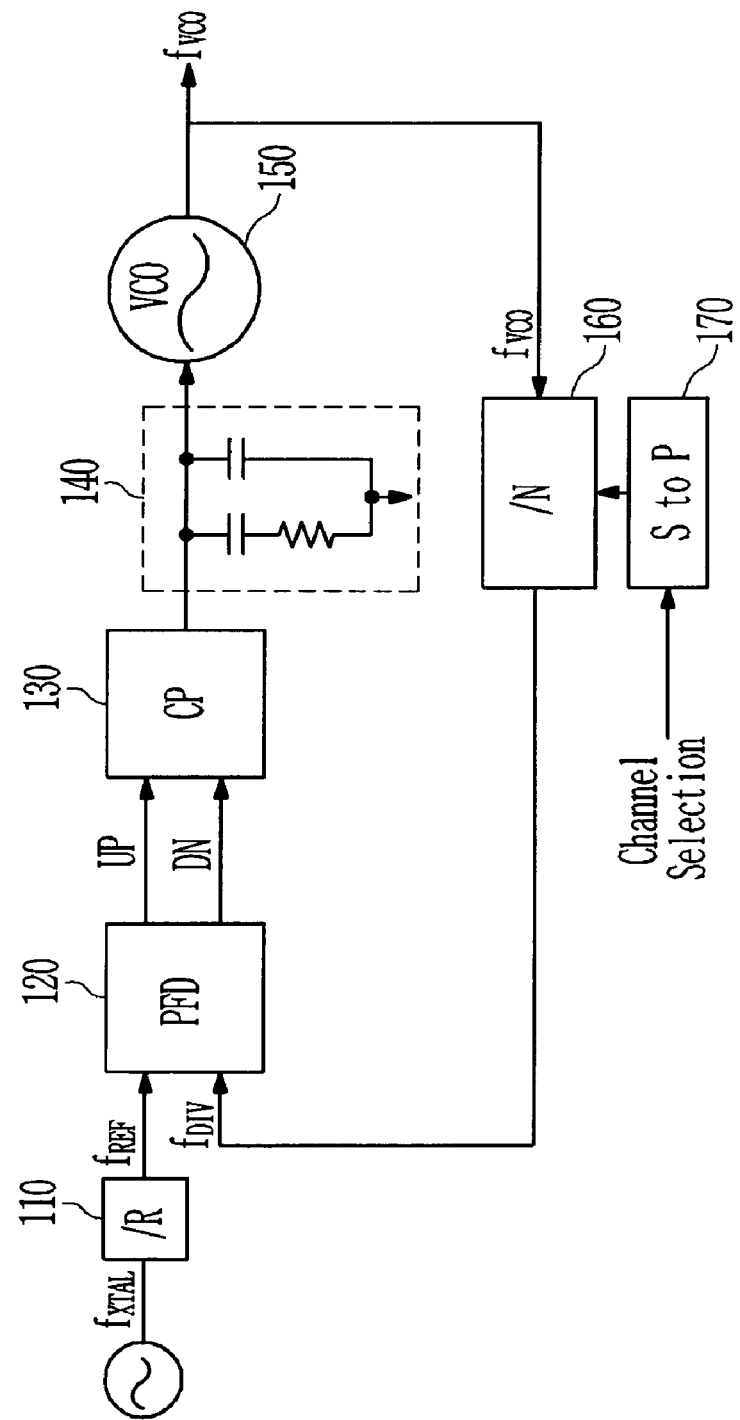
FIG. 1 is a block diagram of an integer-N frequency synthesizer according to a prior art.
Figure 2:
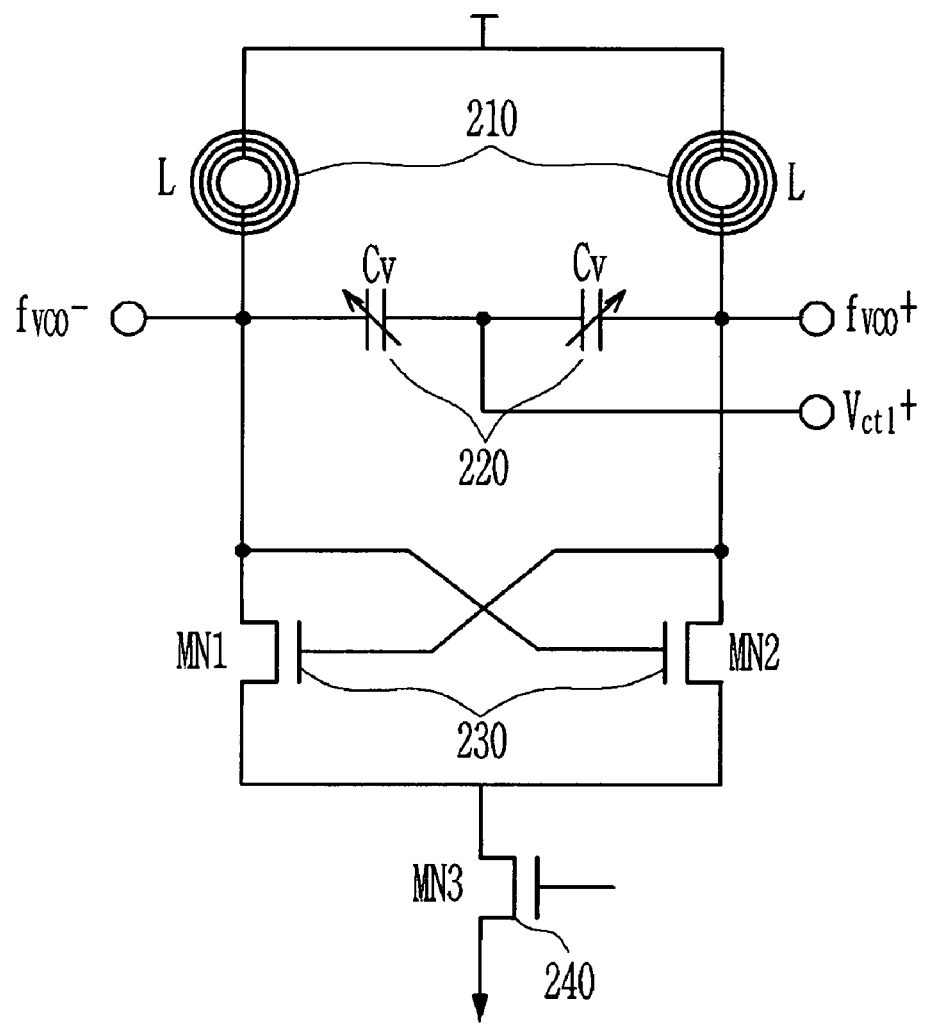
FIG. 2 is a circuit diagram of a differential LC tuned VCO according to a prior art.
Figure 3:
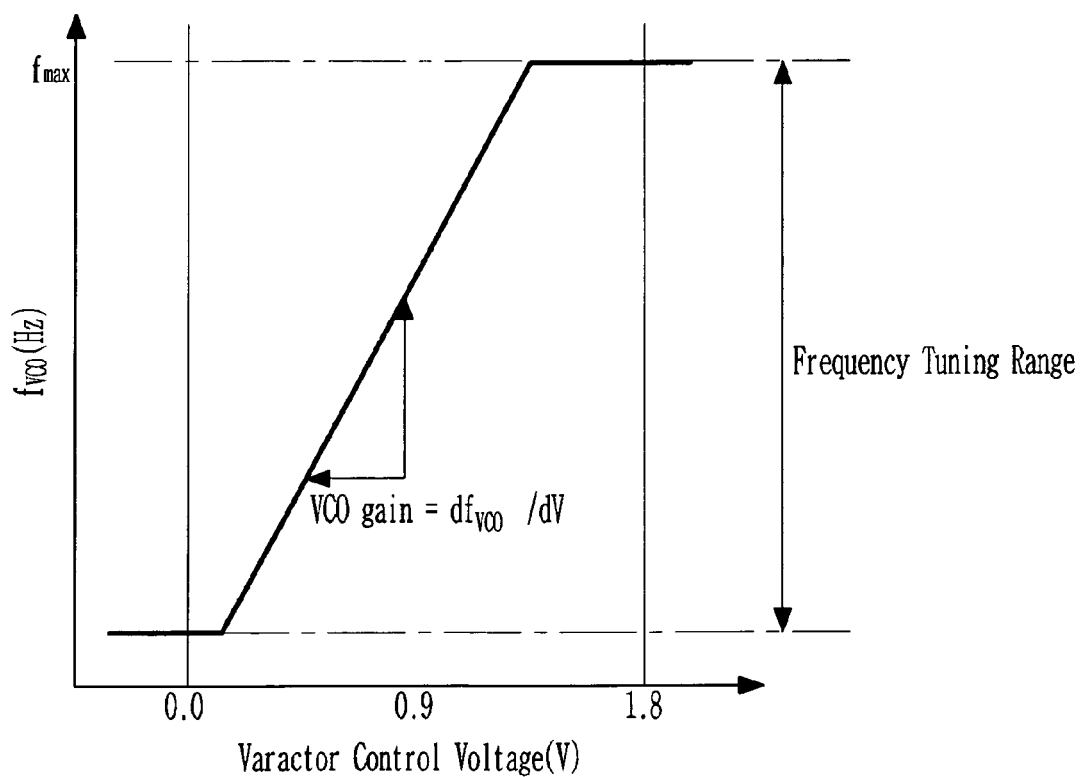
FIG. 3 is a diagram illustrating a curve of an output frequency to an input voltage of the VCO according to the prior art represented in FIG. 2.
Figure 4:
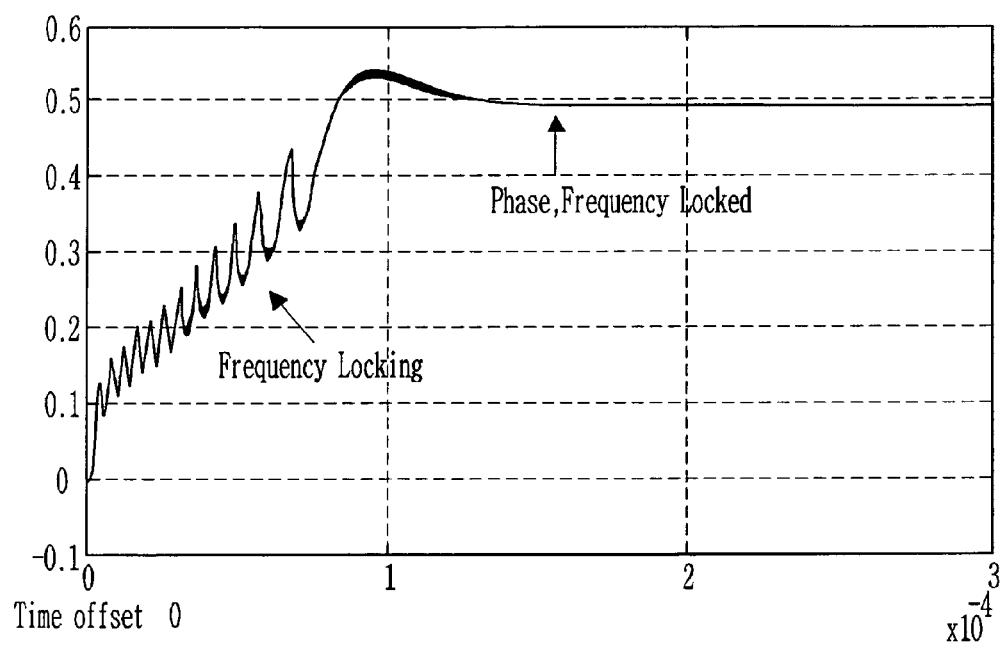
FIG. 4 is a diagram illustrating a result of a simulation experiment for a frequency synchronizing process in a frequency synthesizer according to a prior art.

Hereinafter, preferred embodiments of the present invention will be described in detail with reference to the accompanying drawings. However, the embodiments of the present invention may be varied in several forms, and it should not be construed that the scope of the present invention is limited to the embodiments described below. The embodiments of the present invention are provided to more completely describe the present invention to those skilled in the art.

Hereinafter, the structures of an oscillator and a frequency synthesizer according to an embodiment of the present invention will be described with reference to FIG. 6.

FIG. 6 is a schematic structure diagram of a frequency synthesizer according to an embodiment of the present invention. As shown in FIG. 6, the frequency synthesizer comprises an R divider 310, a phase frequency detector 320, a C divider 330, a current pump 340, an LPF 350, a digital tuner 360, a digital analog tuning (DAT) oscillator 370, and an N divider 380. Additionally, it includes a serial-to-parallel (S-to-P) block 390.

The R divider 310 outputs a reference frequency $f_{XTAL}$, supplied from the exterior of the frequency synthesizer, divided by R.

The phase frequency detector 320 compares the frequency and phase of the input signal $f_{REF}$ to those of the input signal $f_{DIV}$, and outputs signals UP and DN for controlling the current pump according to the results.

The C divider 330 provides a pulse signal PC to the digital tuner 360, intermittently or periodically. Here, the periodically generated pulse signal PC can be implemented by a divider circuit or a counter circuit, which can be reset by a load signal. The period may be a constant or be changed by an external input.

The current pump 340 outputs charges corresponding to the outputs UP and DN of the phase frequency detector 320.

The LPF 350 receives the output current of the current pump 340 and outputs a voltage analog tune (VAT) that is inputted to an analog input end of the DAT oscillator 370.

The digital tuner 360 is a block for performing a function of measuring the output voltage VAT of the LPF 350 intermittently or periodically and changing a digital value inputted to the digital input end of the DAT oscillator 370 according to the state of the output voltage VAT of the LPF. The C divider 330 and the present digital tuner 360 may be collectively called a digital tuner in a broad sense.

The DAT oscillator 370 means an oscillator that the frequency of the output signal is determined by the voltage VAT inputted to the analog input end and the digital value of a voltage digital tune (VDT) inputted to the digital input end.

The DAT oscillator is that can output the oscillating frequency $f_{VCO}$ in proportion to the input control voltage and be turned digitally as well as in analog.

The N divider 380 outputs the input frequency $f_{VCO}$ divided by N.

The S to P block 390 receives serial digital data from the exterior and supplies it to the interior in parallel data.

Hereinafter, the operation of a frequency synthesizer according to an embodiment of the present invention will be discussed with reference to FIG. 7.

FIG. 7 is a waveform diagram illustrating an elementary operation of the frequency synthesizer.

In FIG. 7, the digital tuner checks the state of the output voltage VAT of the LPF by means of a periodical pulse signal PC generated from the C divider, after the N value of the N divider is changed (i.e., after a load signal turns on). If the LPF output voltage VAT is increased from an intermediate voltage to a first threshold voltage or more, a digital value inputted to the DAT oscillator becomes decreased. The reduced digital value implies OFF of a switched capacitor of the DAT oscillator from a resonant circuit, which makes the frequency $f_{VCO}$ of the DAT oscillator be discrete in a moment. On the other hand, if the LPF output voltage VAT is decreased from the intermediate voltage to a second threshold voltage or more, the digital value inputted to the DAT oscillator becomes reduced, which causes an opposite operation. If a filter voltage exists between the first and the second threshold voltages, there is no change in the digital value. With the operation of such a manner, the frequency is converted digitally after the N value of the N divider has been changed.

Hereinafter, primary blocks of a voltage controlled analog digital oscillator according to an embodiment of the present invention will be described in detail with reference to FIGS. 8 to 12. In a broad sense, the voltage controlled analog digital oscillator comprises the C divider, the digital tuner, and the DAT oscillator shown in FIG. 6.

FIG. 8 is a circuit diagram illustrating an example of a digital tuner.

Figure 5:
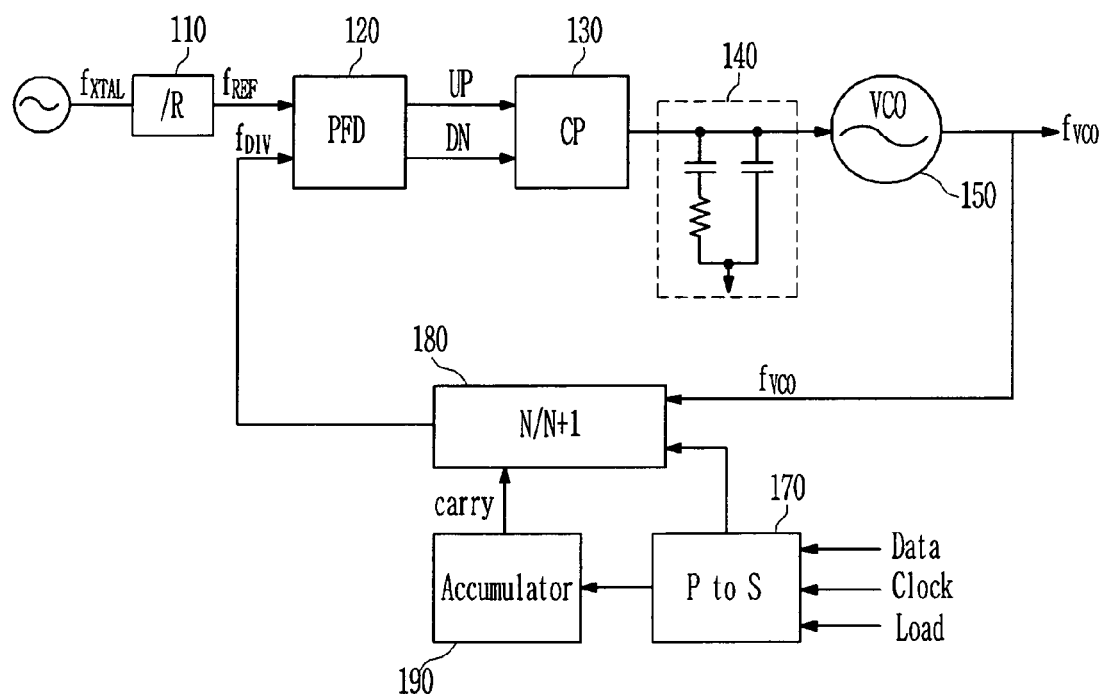
FIG. 5 is a block diagram of a fractional-N frequency synthesizer according to a prior art.

As shown in FIG. 8, the digital tuner includes a switch 410, a comparator 420, and a counter 430. If a pulse signal PC generated by the C divider is inputted, the switch 410 outputs the voltage VAT from the LPF and otherwise outputs an intermediate voltage $V_M$ between a first threshold voltage and a second threshold voltage. The comparator compares the output voltage of the switch 410 to a first threshold voltage $V_H$ and a second threshold voltage $V_L$ and delivers a UP or DN signal to the counter 430 according to the result. The counter 430 counts up, namely, adds 1 when receiving the UP signal and counts down, namely subtracts 1 when receiving the DN signal. An initial value of the counter may be inputted from the S to P 390, as shown in FIG. 5.

FIG. 9 is a structure diagram illustrating another example of a digital tuner in detail.

In FIG. 9, the digital tuner includes an intermediate voltage ($V_M$) generator 510, a switch 520, a comparator 530, and a counter 540.

The intermediate voltage generator 510 outputs an intermediate voltage $V_M$. In the intermediate voltage generator 510, resistors having large resistance values are used for two resistors R1 and R2. While the intermediate voltage is being maintained, there is almost no current consumption since a threshold voltage of a first PMOS transistor MP1 is smaller than that of a second PMOS transistor MP2, in the intermediate voltage generator 510.

The switch 520 is composed of two NMOS transistors MN3 and MN4 and two PMOS transistors MP3 and MP4. The MN3 and the MP3 are complementary switches, and the MN4 and the MP4 are also complementary switches. In case where the periodical pulse signal PC generated in the C divider is a high voltage, the MN4 and MP4 turn on, so that the LPF output voltage VAT becomes an output voltage of the switch 520. On the other hand, the MN3 and MP3 turn on, in case where the output voltage of the C divider is a low voltage, so that the intermediate voltage $V_M$ becomes the output voltage of the switch 520.

The comparator 530 includes a fifth NMOS transistor MN5, a fifth PMOS transistor MP5, two resistors R3 and R4, and three inverters 12, 13 and 14. In the comparator 530, if the output voltage of the switch 520 is lower than a threshold voltage of the fifth NMOS transistor MN5, the DN signal is changed from a low voltage state to a high voltage state, so that a subsequent counter 540 performs the down counting. On the contrary, if the output voltage of the switch 520 is higher than a threshold voltage of the fifth PMOS transistor MP5, the UP signal is generated, so that the subsequent counter 540 operates as an up-counter. If the output voltage of the switch 520 is a voltage between the threshold voltages, both the DN and UP signals have low voltage values, so that the subsequent counter 540 does not operate. Here, two resistors R3 and R4 having large resistance values may be employed.

The counter 540 performs the up or down counting by the UP or DN signal. In addition, frequency locking could be made more rapidly, by allowing the value for the counter to be set from the exterior.

Since the periodical pulse signal PC generated by the C divider is adapted to drive the switch connected to the LPF, new spur other than the spur generated by the phase frequency detector and the current pump may be generated. However, it does not cause a problem since the VCO already has a low gain and thus is insensitive to the noise on the frequency control input.

FIG. 10 is a diagram illustrating an example of a DAT oscillator.

As shown in FIG. 10, the DAT oscillator is composed of inductors 610, variable capacitors 620, active elements 630 operating as negative resistors, an active element 640 for current bias, and a plurality of switched capacitors 650. In order to vary the capacitance of the resonant circuit, the present DAT oscillator employs a variable capacitor and a switched capacitor together. In the case of the variable capacitor, capacitance is varied continuously according to an analog input voltage Vctl, and, in the case of the switched capacitor, capacitance is varied discretely by turning on or off a switch according to a digital input.

FIG. 11 is a diagram representing a frequency curve 710 to an input voltage of the VCO according to the prior art, and frequency curves 721 to 726 to an input voltage of the DAT oscillator shown in FIG. 9. As seen from the diagram, the DAT oscillator has an advantage that a broad band of frequency variance range can be obtained by using the switched capacitor, even though it employs a variable capacitor and an inductor having low VCO gain. In addition, the capacitor controlled by the switch has the maximum performance index because there is almost no parasitic capacitor problem, as compared with the variable capacitor. In the case of the variable capacitor used with the switched capacitor, the parasitic capacitor can be minimized by virtue of its small size. Thus, the performance index of total capacitance is significantly enhanced as compared to the prior art VCO, so that almost all capacitances can be employed for the frequency variance. Further, even in case where wideband is required, an inductor with maximal inductance can be used, thereby reducing current consumption in the oscillator.

FIG. 12 illustrates three typical cases of configurations of a resonant circuit in the DAT oscillator.

In FIG. 12, an A type DAT oscillator 810 is adapted to tune discrete inductance by digitally controlling an inductor, and to tune a variable capacitor in analog. That is, the A type DAT oscillator 810 includes a variable capacitor having variable capacitance depending on a voltage inputted to an analog input end, and a variable inductor having inductance varied by a digital value inputted to a digital input end. Here, the variable inductor includes a plurality of inductors, and is connected in parallel to the variable capacitor. However, there are disadvantages that it is difficult to finely tune the inductor as in capacitor tuning if a silicon process incorporates an integrated planar inductor, and the use of a switch in the inductor has a bad influence upon the quality factor of the resonant circuit (hereinafter, referred to as Q). However, it may be advantageous to tune an inductor in an aspect of whole current consumption in order to tune the higher frequency.

A B type DAT oscillator 820 employs a typical switched capacitor. It is configured to realize the fine tuning of a fixed inductor through a variable capacitor and a switched capacitor. That is, the B type DAT oscillator 820 includes an inductor, a first variable capacitor with capacitance varied depending on a voltage inputted to an analog input end, and a second variable capacitor having capacitance varied by a digital value inputted to a digital input end. Here, the second variable capacitor includes a plurality of capacitors, and the inductor, the first variable capacitor and the second variable capacitor are connected to one another in parallel.

A C type DAT oscillator 830 is configured by adding a digitally tuned inductor to the circuit of the B type DAT oscillator 820. That is, the C type DAT oscillator 830 includes a variable inductor with inductance varied by a digital value inputted to a digital input end, a first variable capacitor with capacitance varied depending on a voltage inputted to an analog input end, and a second variable capacitor with capacitance varied by a digital value inputted to the digital input end. Here, the variable inductor includes a plurality of inductors; the second variable capacitor includes a plurality of capacitors; and the variable inductor, the first variable capacitor and the second variable capacitor are connected to one another in parallel. In this case, extensive frequency variance can be realized by tuning the inductor, thereby accomplishing current consumption suitable for a variable frequency range.

Hereinafter, the DC property and the frequency tracking process of a frequency synthesizer according to an embodiment of the present invention will be described with reference to FIGS. 13 and 14.

FIG. 13 is a diagram illustrating the DC property of the frequency synthesizer according to an embodiment of the present invention. In FIG. 13, if the frequency of the VCO is in a range indicated by a reference numeral 910, accompanied with the down counting in the digital tuner, the frequency is shifted to a lower frequency band by one step when a periodical pulse signal PC generated in the C divider is generated. If the frequency of the VCO is in a range indicated by a reference numeral 920, accompanied with the up counting, the frequency is shifted to a higher frequency band by one step. When the frequency synthesizer is locked, the VCO frequency comes to be positioned always between $V_L$ and $V_H$.

FIG. 14 is a diagram illustrating a frequency tracking process in operation of the frequency synthesizer. In FIG. 14, a predetermined frequency $f_1$ denotes an initial frequency, and a changed frequency $f2$ denotes a frequency following change. Reference numerals 1010, 1020 and 1030 denote periodical comparing time points or passage points. If new channel data is programmed at the frequency $f_1$, namely, if the new output frequency $f_2$ of the VCO is set, the frequency is shifted to the point indicated by the reference numeral 1010 by the analog PLL loop. If the down counting occurs by the periodical pulse signal PC, generated in the divider, at the point indicated by the reference numeral 1010, the frequency is shifted to the point indicated by the reference numeral 1020. Since a desired frequency is not synthesized at the point indicated by the reference numeral 1020 as well, the frequency stays at the point indicated by the reference numeral 1020 and is shifted again to the point indicated by the reference numeral 1030 by the periodical pulse signal PC generated in the divider. The frequency is then shifted to the frequency $f2$ by the analog PLL loop and the frequency synthesizer is finally locked. Thereafter, it will be appreciated that the output digital value of the counter positioned in the digital tuner is maintained as it is since the locked voltage of the filter is between $V_L$ and $V_H$, although measuring the voltage of the filter by the periodical pulse signal PC generated at the divider.

Hereinafter, stability of a frequency synthesizer according to an embodiment of the present invention will be discussed with reference to FIGS. 15 to 18.

The frequency synthesizer using the DAT oscillator as illustrated in FIGS. 15 and 16 operates in a stabilized manner. However, in the case of FIG. 15, it requires attention in designing the VCO since respective frequency bands depending on an output digital value of the counter positioned in the digital tuner should be overlapped one another.

The frequency synthesizer using the DAT oscillator illustrated in FIGS. 17 and 18 operates in an unstable manner. That is, oscillation occurs. If a desired locking frequency is greater than $V_H$ in the frequency band depending on the counter output digital value of a given digital tuner, and also below $V_L$ in the next frequency band depending on the counter output digital value of the digital tuner after the counter performs up-counting, the frequency synthesizer using the DAT oscillator operates in a unstable manner.

In FIGS. 15 to 18, it can be seen that the operation is stable if a difference between the frequency of the output signal depending on the first threshold voltage and the frequency of the output signal depending on the second threshold voltage is larger than the minimum frequency width that can be changed due to the change of the digital value, while the digital value is fixed.

Hereinafter, a result of a simulation experiment for a transient response after designing functional blocks of the frequency synthesizer using Matlab, which is one simulation program, according to the embodiment of the present invention will be described with reference to FIGS. 19 to 20.

FIG. 19 is the case that the dividing ratio N of the N divider is shifted from 2400 to 2455, and FIG. 20 shows that the N is shifted from 165 to 175 and then to 168. It will be appreciated that coarse frequency variance is made by the digital tuner after the N is changed, and then a desired frequency is exactly outputted by the LPF voltage of the loop filter, as described in FIGS. 19 and 20.

Hereinafter, a fractional-N frequency synthesizer according to another embodiment of the present invention will be described with reference to FIG. 21.

FIG. 21 is a diagram schematically illustrating the fractional-N frequency synthesizer according to another embodiment of the present invention. In FIG. 21, the fractional-N frequency synthesizer comprises an R divider 1110, a phase frequency detector (PFD) 1120, a C divider 1130, a current pump (CP) 1140, a low pass filter (LPF) 1150, a digital tuner (DT) 1160, a DAT_VCO 1170, an N/N+1 divider 1180, and an accumulator 1190. Further, it may include a parallel to serial (P to S) block 1200. Here, the R divider 1110, the phase frequency detector 1120, the C divider 1130, the current pump 1140, the LPF 1150, the digital tuner 1160, and the DAT_VCO 1170 are the same as respective blocks of the integer-N frequency synthesizer illustrated in FIG. 6. The N/N+1 divider 1180 is a divider circuit having a dual-modulus dividing ratio of dividing ratios N and N+1, in which one of the dividing ratios N and N+1 is selected by a carry signal C. The accumulator 1190 accumulates incoming values and generates the carry signal C according to the result. Therefore, the frequency synthesizer according to another embodiment of the present invention has an advantage of reducing spur power since the frequency synthesizer becomes insensitive to periodic noise originated from LPF voltage, by using the DAT oscillator that can make the VCO gain be very small.

According to the present invention, the oscillator and the frequency synthesizer have an advantage that a wideband frequency output can be obtained while the noise outputted from the oscillator can be reduced.

In addition, according to the present invention, the oscillator and the frequency synthesizer have advantages that they are suitable for supplying a frequency for converting a radio frequency (RF) signal to an intermediate frequency (IF) signal or a base band signal.

Further, according to the present invention, the oscillator and the frequency synthesizer have an advantage of having an extensive variable frequency range, a small gain of the VCO, small parasitic capacitance, and less noise and spur.

The invention claimed is:

1. A voltage controlled digital analog oscillator, comprising:
    an oscillator wherein a frequency of an output signal is determined by a voltage inputted to an analog input end and a digital value inputted to a digital input end;
    a digital tuner for comparing the voltage inputted to the analog input end with first and second threshold voltages, and changing the digital value inputted to the digital input end according to the result; and
    a C-divider adapted to generate a periodic pulse signal (PC) from a reference frequency to drive the digital tuner.

2. The voltage controlled digital analog oscillator according to claim 1, wherein
    the oscillator comprises first and second inductors, first and second variable capacitors, first and second NMOS transistors, a current power supply and an even number plurality of switched capacitors, wherein:
the first inductor is connected to a higher voltage power supply and a first node;
the second inductor is connected to the higher voltage power supply and a second node;
the first capacitor is connected to the first node and the analog input end;
the second capacitor is connected to the second node and the analog input end;
a first source and drain is connected to the first node, a gate is connected to the second node, and a second source and drain is connected to a third node, in the first NMOS transistor;
a first source and drain is connected to the second node, a gate is connected to the first node, and a second source and drain is connected to the third node, in the second NMOS transistor;
the current power supply is connected to the third node and a lower voltage power supply;
both ends of half of the switched capacitors are connected between the first node and the lower voltage power supply and switches thereof are connected to the digital input end;
both ends of the remainder of the switched capacitors are connected between the second node and the lower voltage power supply and switches thereof are connected to the digital input end; and
a first output of differential outputs is connected to the first node and a second output is connected to the second node.

3. The voltage controlled digital analog oscillator according to claim 1, wherein the oscillator comprises:
an inductor;
a first variable capacitor having capacitance varied depending on the voltage inputted to the analog input end; and
a second variable capacitor including a plurality of capacitors, and having capacitance varied by the digital value inputted to the digital input end, wherein the inductor, the first variable capacitor and the second variable capacitor are connected to one another in parallel.

4. The voltage controlled digital analog oscillator according to claim 1, wherein the oscillator comprises:
a variable capacitor having capacitance varied depending on the voltage inputted to the analog input end; and
a variable inductor including a plurality of inductors, and having inductance varied by the digital value inputted to the digital input end, wherein the variable capacitor and the variable inductor are connected to each other in parallel.

5. The voltage controlled digital analog oscillator according to claim 1, wherein the oscillator includes:
a variable inductor including a plurality of inductors, and having inductance varied by the digital value inputted to the digital input end;
a first variable capacitor having capacitance varied depending on the voltage inputted to the analog input end; and
a second variable capacitor including a plurality of capacitors, and having capacitance varied by the digital value inputted to the digital input end, wherein the variable inductor, the first variable capacitor and the second variable capacitor are connected to one another in parallel.

6. The voltage controlled digital analog oscillator according to claim 1, wherein the digital tuner includes:
a first element for generating an intermittent signal; and
a second element for comparing the voltage inputted to the analog input end with the first and the second threshold voltages, and changing the digital value inputted to the digital input end according to the result, in case where the intermittent signal is generated.

7. The voltage controlled digital analog oscillator according to claim 6, wherein the first element receives a signal having a predetermined frequency, and outputs a signal having a frequency divided by a predetermined integer as the intermittent signal.

8. The voltage controlled digital analog oscillator according to claim 7, wherein the predetermined integer can be changed by a signal given from the exterior.

9. The voltage controlled digital analog oscillator according to claim 6, wherein the second element includes:
a switch for outputting the voltage inputted to the analog input end when the intermittent signal is inputted, and outputting a voltage between the first threshold voltage and the second threshold voltage, otherwise;
a comparator for comparing the output voltage of the switch with the first and the second threshold voltages, and outputting the result; and a counter for performing up-counting, down-counting, or no counting according to the output of the comparator.

10. The voltage controlled digital analog oscillator according to claim 9, wherein the value of the counter can be changed by a signal given from the exterior.

11. The voltage controlled digital analog oscillator according to claim 1, wherein a difference between the frequency of the output signal by the first threshold voltage and the frequency of the output signal by the second threshold voltage is larger than a minimum frequency width that can be changed by the change of the digital value, while the digital value is fixed.

12. A frequency synthesizer comprising a phase frequency detector, a current pump, a low pass filter, a digital tuner, an oscillator, a C-divider and a first N-divider, wherein:
the phase frequency detector compares frequency and phase of a predetermined input signal with those of an output signal of the first divider, and outputs a signal for controlling the current pump according to the result;
the current pump supplies any one of a positive current and a negative current to the low pass filter depending on the output signal of the phase frequency detector;
the low pass filter receives an output current of the current pump, and outputs a voltage inputted to an analog input end of the oscillator;
the digital tuner intermittently compares the voltage inputted to the analog input end of the oscillator with first and second threshold voltages, and changes a digital value inputted to a digital input end of the oscillator according to the result;
the oscillator changes and outputs a frequency of the output signal, depending on the changes of the voltage inputted to the analog input end and the digital value inputted to the digital input end;
the C-divider adapted to generate a periodic pulse signal (PC) from a reference frequency to drive the digital tuner; and
the first N-divider outputs a signal having the frequency of the output signal of the oscillator divided by a first integer (N).

13. The frequency synthesizer according to claim 12, further comprising a second N-divider for receiving a signal having a predetermined frequency, and inputting a signal having the frequency divided by a second integer (N+1), as the predetermined input signal of the phase frequency detector.

14. The frequency synthesizer according to claim 12, wherein the low pass filter comprises a resistor, and first and second capacitors, wherein:
- both ends of the resistor and the first capacitor, which are connected in serial, are connected to a first node and a second node;
- the second capacitor is connected to the first node and the second node;
- the first node is connected to the input end and the output end; and
- the second node is connected to a voltage power supply.

15. The frequency synthesizer according to claim 12, wherein the digital tuner includes:
- a first element for receiving the predetermined input signal of the phase frequency detector, and outputting a signal having a frequency of the signal divided by a third integer, as an intermittent signal; and a second element for comparing the voltage inputted to the analog input end of the oscillator with the first and the second threshold voltages, and changing the digital value inputted to the digital input end of the oscillator according to the result, in case where the intermittent signal is generated.

16. The frequency synthesizer according to claim 12, wherein a difference between the frequency of the output signal of the oscillator by the first threshold voltage and the frequency of the output signal of the oscillator by the second threshold voltage is larger than a minimum frequency width of the output signal of the oscillator that may be changed by the change of the digital value inputted to the digital input end of the oscillator, while the digital value inputted to the digital input end of the oscillator is fixed.

17. A frequency synthesizer comprising a phase frequency detector, a current pump, a low pass filter, a digital tuner, an oscillator and a first divider, wherein:
- the phase frequency detector compares frequency and phase of a predetermined input signal with those of an output signal of the first divider, and outputs a signal for controlling the current pump according to the result;
- the current pump supplies any one of a positive current and a negative current to the low pass filter depending on the output signal of the phase frequency detector;
- the low pass filter receives an output current of the current pump, and outputs a voltage inputted to an analog input end of the oscillator;
- the digital tuner intermittently compares the voltage inputted to the analog input end of the oscillator with first and second threshold voltages, and changes a digital value inputted to a digital input end of the oscillator according to the result;
- the oscillator changes and outputs a frequency of the output signal, depending on the changes of the voltage inputted to the analog input end and the digital value inputted to the digital input end; and
- the first divider outputs the frequency of the output signal of the oscillator divided by a first integer in a predetermined period, and by a value obtained by adding 1 to the first integer in other periods.

18. The frequency synthesizer according to claim 17, wherein the first divider includes:
- a first element for performing an accumulation operation and outputting a signal for determining whether to divide the frequency of the output signal of the oscillator by the first integer, or by the value obtained by adding 1 to the first integer, according to the result; and
- a second element for outputting the frequency of the output signal of the oscillator divided by the first integer or the value obtained by adding 1 to the first integer, according to the output signal of the first element.

19. The frequency synthesizer according to claim 17, wherein the digital tuner includes:
- a first element for receiving the predetermined input signal of the phase frequency detector and outputting a signal having a frequency of the signal divided by a predetermined integer, as an intermittent signal; and
- a second element for comparing the voltage inputted to the analog input end of the oscillator with the first and second threshold voltages, and changing the digital value inputted to the digital input end of the oscillator according to the result, in case where the intermittent signal is generated.

20. The frequency synthesizer according to claim 17, wherein a difference between the frequency of the output signal of the oscillator by the first threshold voltage and the frequency of the output signal of the oscillator by the second threshold voltage is larger than a minimum frequency width of the output signal of the oscillator that may be changed by the change of the digital value inputted to the digital input end of the oscillator, while the digital value inputted to the digital input end of the oscillator is fixed.

* * * * *